United States Patent
Porshnev et al.

(10) Patent No.: US 8,273,624 B2
(45) Date of Patent: Sep. 25, 2012

(54) PLASMA IMMERSED ION IMPLANTATION PROCESS USING BALANCED ETCH-DEPOSITION PROCESS

(75) Inventors: Peter Porshnev, San Jose, CA (US); Majeed A. Foad, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/941,526

(22) Filed: Nov. 8, 2010

(65) Prior Publication Data

US 2011/0053360 A1 Mar. 3, 2011

Related U.S. Application Data

(63) Continuation of application No. 11/748,876, filed on May 15, 2007, now Pat. No. 7,838,399, which is a continuation-in-part of application No. 11/608,357, filed on Dec. 8, 2006, now Pat. No. 7,732,309.

(51) Int. Cl.
*H01L 21/8242* (2006.01)
(52) U.S. Cl. .. 438/243; 438/270; 438/513; 257/E21.317
(58) Field of Classification Search .................. 438/243, 438/270, 513; 257/E21.317
See application file for complete search history.

(56) References Cited

U.S. PATENT DOCUMENTS

| | | | |
|---|---|---|---|
| 5,969,398 A * | 10/1999 | Murakami | ...................... 257/412 |
| 7,838,399 B2 | 11/2010 | Porshnev et al. | |
| 2003/0153165 A1 | 8/2003 | Kondo et al. | |
| 2004/0166612 A1 | 8/2004 | Maydan et al. | |
| 2005/0090080 A1 | 4/2005 | Fogel et al. | |
| 2005/0130424 A1 | 6/2005 | Bedell et al. | |
| 2005/0269520 A1 | 12/2005 | Horsky et al. | |
| 2006/0011906 A1 | 1/2006 | Bedell et al. | |
| 2006/0073683 A1 | 4/2006 | Collins et al. | |
| 2006/0081558 A1 | 4/2006 | Collins et al. | |
| 2006/0105507 A1 | 5/2006 | Ieong et al. | |
| 2006/0226480 A1 | 10/2006 | Furukawa et al. | |

OTHER PUBLICATIONS

Chu et al.,"Plasma Ion Implantation . . .", Materials Science and Engineering R17 1996 pp. 207-280.*
International Search Report and Written Opinion of the International Searching Authority mailed Apr. 30, 2008 in PCT/US07/86848.

* cited by examiner

*Primary Examiner* — Julio J. Maldonado
*Assistant Examiner* — Sonya McCall Shepard
(74) *Attorney, Agent, or Firm* — Patterson & Sheridan, LLP

(57) ABSTRACT

Methods for implanting ions into a substrate by a plasma immersion ion implanting process are provided. In one embodiment, a method for implanting ions into a substrate includes providing a substrate into a processing chamber, generating a plasma from a gas mixture including a reacting gas and a etching gas in the chamber, adjusting the ratio between the reacting gas and the etching gas in the supplied gas mixture and implanting ions from the plasma into the substrate. In another embodiment, the method includes providing a substrate into a processing chamber, supplying a gas mixture including reacting gas and a halogen containing reducing gas into the chamber, forming a plasma from the gas mixture, gradually increasing the ratio of the etching gas in the gas mixture, and implanting ions from the gas mixture into the substrate.

6 Claims, 3 Drawing Sheets

PLASMA IMMERSED ION IMPLANTATION PROCESS USING BALANCED ETCH-DEPOSITION PROCESS

CROSS-REFERENCE TO OTHER APPLICATIONS

This application is a continuation of Ser. No. 11/748,876, filed May 15, 2007 now U.S. Pat. No. 7,838,399, which is a continuation-in-part of U.S. patent application Ser. No. 11/608,357, filed Dec. 8, 2006, now U.S. Pat. No. 7,732,309, each of which is herein incorporated by reference.

BACKGROUND OF THE INVENTION

1. Field of the Invention

Embodiments of the invention generally relate to the field of semiconductor manufacturing processes and devices, more particular, to methods of implanting ions into a substrate by a plasma immersion ion implantation process.

2. Description of the Related Art

Integrated circuits may include more than one million micro-electronic field effect transistors (e.g., complementary metal-oxide-semiconductor (CMOS) field effect transistors) that are formed on a substrate (e.g., semiconductor wafer) and cooperate to perform various functions within the circuit. A CMOS transistor comprises a gate structure disposed between source and drain regions that are formed in the substrate. The gate structure generally comprises a gate electrode and a gate dielectric layer. The gate electrode is disposed over the gate dielectric layer to control a flow of charge carriers in a channel region formed between the drain and source regions beneath the gate dielectric layer.

An ion implantation process is typically utilized to implant and dope ions into the substrate, forming the gate and source drain structure with desired profile and concentration on the substrate. During an ion implantation process, different process gases or gas mixtures may be used to provide ion source species. As the process gases supplied into the ion implantation processing chamber, a RF power may be generated to produce a plasma to promote ion dissociation in the process gases and accelerate the dissociated ions toward and into the surface of the substrate. As ions accelerated to the substrate surface are typically in a linear movement, e.g., one directional movement, the ions are mostly implanted into a bottom surface of a structure, e.g., patterns or trenches, formed on the substrate surface rather than to sidewalls of the structure. Non-conformal ion doping may result in insufficient and/or non-uniform ion concentration, profile, dimension, and distribution across the substrate surface, thereby adversely affecting the overall electrical device performance. As critical dimensions shrink, the precision of ion implantation becomes increasingly important.

Therefore, there is a need for an improved ion implantation process.

SUMMARY OF THE INVENTION

Methods for implanting ions into a substrate by a plasma immersion ion implantation processing having a balanced etch-deposition process are provided. In one embodiment, a method for implanting ions into a substrate includes providing a substrate into a processing chamber, generating a plasma from a gas mixture including a reacting gas and a etching gas in the chamber, adjusting the ratio between the reacting gas and the etching gas in the supplied gas mixture and implanting ions from the plasma into the substrate.

In another embodiment, a method for implanting ions into a substrate includes providing a substrate into a processing chamber, supplying a gas mixture including reacting gas and a halogen containing etching gas into the chamber, forming a plasma from the gas mixture, and increasing the relative amount of the etching gas in the gas mixture while implanting ions from the gas mixture into the substrate.

In yet another embodiment, a method for implanting ions into a substrate includes providing a substrate into a processing chamber, supplying a gas mixture including reacting gas and a halogen containing etching gas into the chamber, forming a plasma from the gas mixture, increasing the ratio of the etching gas to the reacting gas present in the gas mixture, and implanting ions from the gas mixture into the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the invention provide methods for implanting ions into a substrate by a plasma immersion ion implantation process. The invention may be used in gate structure or source/drain region formation including, but not limited to, poly doping, counter-poly doping, ultra shallow junction, and conformal doping for structures formed on a substrate, among others. The ion implantation process may be utilized in different applications, such as DRAM, logic products, flash memory, and so on. In one embodiment, the ion implantation process is performed by supplying a gas mixture including a reacting gas and an etching gas into a processing chamber. A plasma is generated to dissociate ions from the gas mixture, thereby forming a source of ions that are accelerated toward and implanted into an electrically biased substrate. The ratio between the reacting gas and the etching gas supplied in the gas mixture may be gradually changed during the ion implantation process, thereby dynamically changing the ion species during implanting. The ratio change also provides a conformal doping profile in the bottom and side wall of structures disposed on the substrate surface.

Figure 1A:
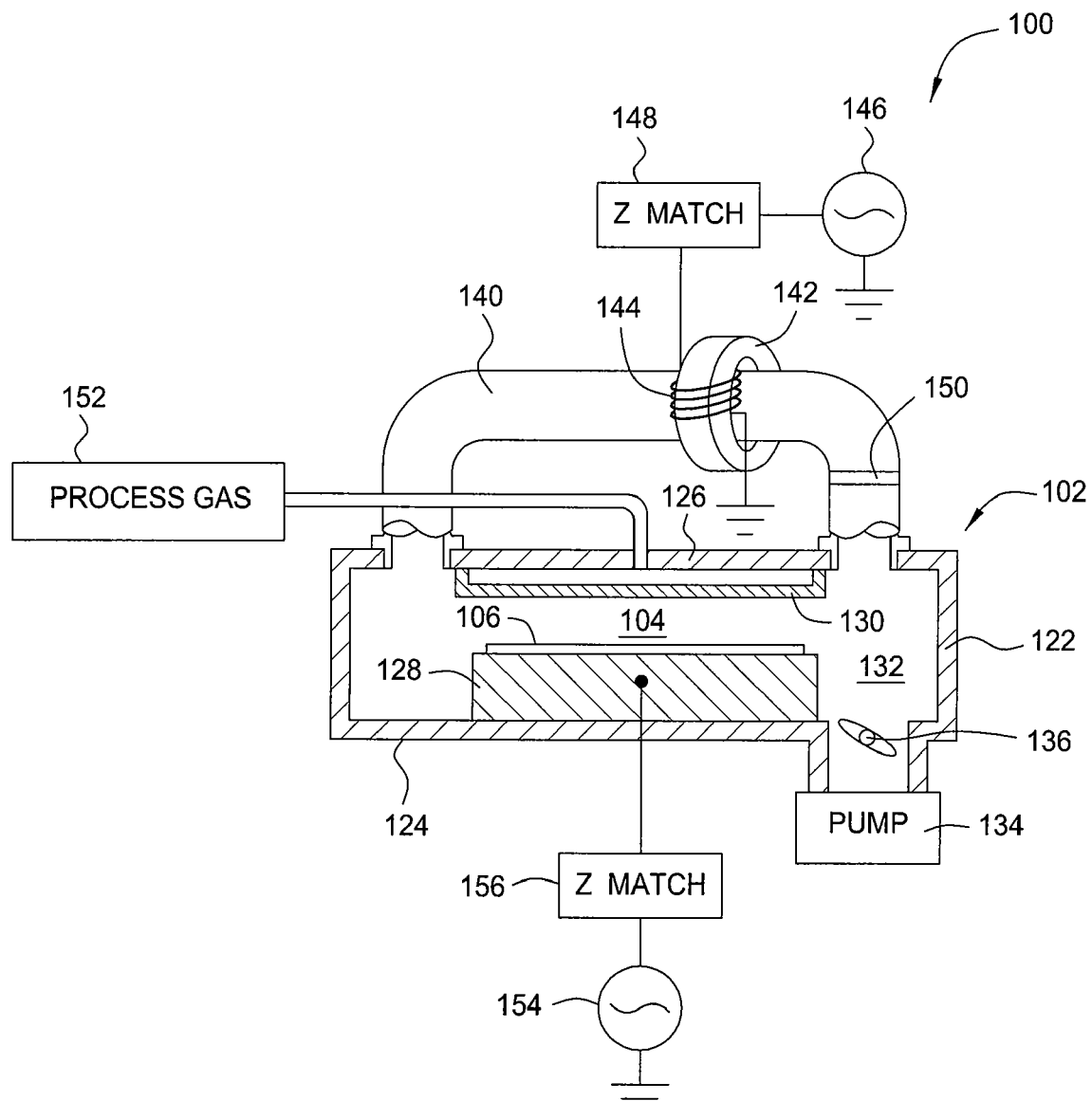
FIGS. 1A-1B depict one embodiment of a plasma immersion ion implantation tool suitable for practice the present invention.

FIG. 1A depicts a plasma reactor 100 that may be utilized to practice an ion implantation process according to one embodiment of the invention. One suitable reactor in which the process may be practiced is a P3i® reactor, available from Applied Materials, Inc., of Santa Clara, Calif. It is contemplated that the methods described herein may be practiced in other suitably adapted plasma reactors, including those from other manufacturers.

The plasma reactor 100 includes a chamber body 102 having a bottom 124, a top 126, and side walls 122 enclosing a process region 104. A substrate support assembly 128 is supported from the bottom 124 of the chamber body 102 and is adapted to receive a substrate 106 for processing. A gas distribution plate 130 is coupled to the top 126 of the chamber body 102 facing the substrate support assembly 128. A pumping port 132 is defined in the chamber body 102 and coupled to a vacuum pump 134. The vacuum pump 134 is coupled through a throttle valve 136 to the pumping port 132. A gas source 152 is coupled to the gas distribution plate 130 to supply gaseous precursor compounds for processes performed on the substrate 106.

Figure 1B:
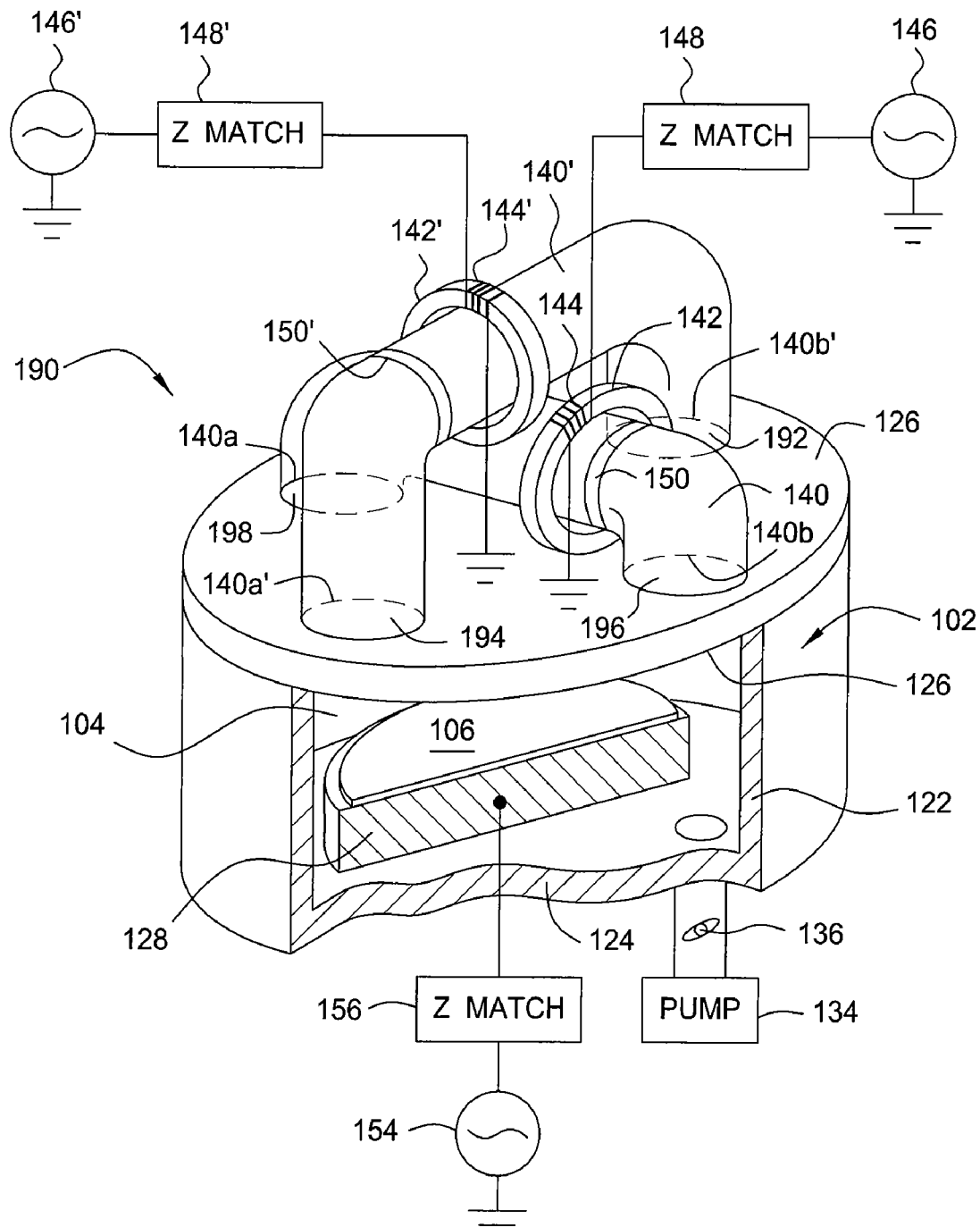

The reactor 100 depicted in FIG. 1A further includes a plasma source 190 best shown in the perspective view of FIG. 1B. The plasma source 190 includes a pair of separate external reentrant conduits 140, 140' mounted on the outside of the top 126 of the chamber body 102 disposed transverse to one another (or orthogonal to one another as the exemplary embodiment depicted in FIG. 1B). The first external conduit 140 has a first end 140a coupled through an opening 198 formed in the top 126 into a first side of the process region 104 in the chamber body 102. A second end 140b has an opening 196 coupled into a second side of the process region 104. The second external reentrant conduit 140b has a first end 140a' having an opening 194 coupled into a third side of the process region 104 and a second end 140b' having an opening 192 into a fourth side of the process region 104. In one embodiment, the first and second external reentrant conduits 140, 140' are configured to be orthogonal to one another, thereby providing the two ends 140a, 140a', 140b, 140b' of each external reentrant conduits 140, 140' disposed at about 90 degree intervals around the periphery of the top 126 of the chamber body 102. The orthogonal configuration of the external reentrant conduits 140, 140' allows a plasma source distributed uniformly across the process region 104. It is contemplated that the first and second external reentrant conduits 140, 140' may have other configurations utilized to control plasma distribution in the process region 104.

Magnetically permeable torroidal cores 142, 142' surround a portion of a corresponding one of the external reentrant conduits 140, 140'. The conductive coils 144, 144' are coupled to respective RF plasma source power generators 146, 146' through respective impedance match circuits or elements 148, 148'. Each external reentrant conduits 140, 140' is a hollow conductive tube interrupted by an insulating annular ring 150, 150' respectively that interrupts an otherwise continuous electrical path between the two ends 140a, 140b (and 140a', 104b') of the respective external reentrant conduits 140, 140'. Ion energy at the substrate surface is controlled by an RF plasma bias power generator 154 coupled to the substrate support assembly 128 through an impedance match circuit or element 156.

Referring back to FIG. 1A, process gases including gaseous compounds supplied from the process gas source 152 are introduced through the overhead gas distribution plate 130 into the process region 104. RF source plasma power 146 is coupled from the power applicators 142, 144 to gases supplied in the conduit 140, which creates a circulating plasma current in a first closed torroidal path including the external reentrant conduit 140 and the process region 104. Also, RF source power 146' may be coupled from the other power applicators 142', 144' to gases in the second conduit 140', which creates a circulating plasma current in a second closed torroidal path transverse (e.g., orthogonal) to the first torroidal path. The second torroidal path includes the second external reentrant conduit 140' and the process region 104. The plasma currents in each of the paths oscillate (e.g., reverse direction) at the frequencies of the respective RF source power generators 146, 146', which may be the same or slightly offset from one another.

In one embodiment, the process gas source 152 provides different process gases that may be utilized to provide ions implanted to the substrate 106. Suitable examples of process gases include $B_2H_6$, $BF_3$, $SiH_4$, $SiF_4$, $PH_3$, $P_2H_5$, $PO_3$, $PF_3$, $PF_5$ and $CF_4$, among others. The power of each plasma source power generators 146, 146' is operated so that their combined effect efficiently dissociates the process gases supplied from the process gas source 152 and produces a desired ion flux at the surface of the substrate 106. The power of the RF plasma bias power generator 154 is controlled at a selected level at which the ion energy dissociated from the process gases may be accelerated toward the substrate surface and implanted at a desired depth below the top surface of the substrate 106 in a desired ion concentration. For example, with relatively low RF power, such as less than about 50 eV, relatively low plasma ion energy may be obtained. Dissociated ions with low ion energy may be implanted at a shallow depth between about 0 Å and about 100 Å from the substrate surface. Alternatively, dissociated ions with high ion energy provided and generated from high RF power, such as higher than about 50 eV, may be implanted into the substrate having a depth substantially over 100 Å depth from the substrate surface.

The combination of the controlled RF plasma source power and RF plasma bias power dissociates ion in the gas mixture having sufficient momentum and desired ion distribution in the processing chamber 100. The ions are biased and driven toward the substrate surface, thereby implanting ions into the substrate in a desired ion concentration, distribution and depth from the substrate surface. Furthermore, the controlled ion energy and different types of ion species from the supplied process gases allow ions to be implanted in the substrate 106 to form desired device structures, such as gate structure and source drain region on the substrate 106.

Figure 2:
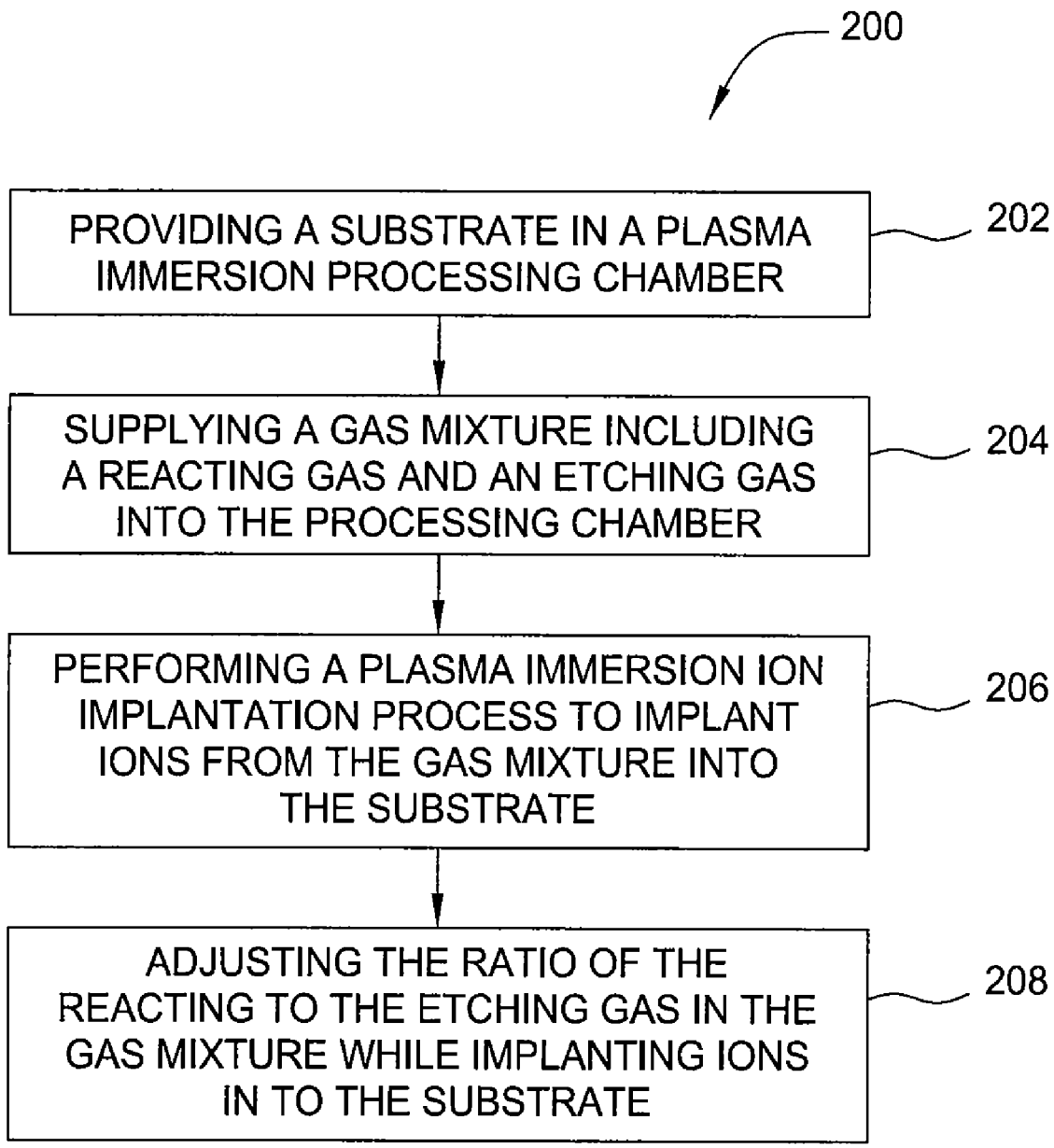
FIG. 2 depicts a process diagram illustrating a method for plasma immersion ion implantation process according to one embodiment of the present invention.

FIG. 2 depicts a process flow diagram of a method 200 for implanting ions into a substrate by a plasma immersion ion implantation process. The method 200 may be performed in a plasma immersion ion implantation processing chamber, such as the processing chamber 100, as described in FIG. 1A-1B, or other suitably adapted chamber.

The method 200 begins at step 202 by providing a substrate in the processing chamber 100. In one embodiment, the substrate may be a material such as silicon oxide, silicon carbide, crystalline silicon (e.g., Si<100> or Si<111>), strained silicon, silicon germanium, doped or undoped polysilicon, doped or undoped silicon wafers, doped silicon, germanium, gallium arsenide, gallium nitride, glass, and sapphire. The substrate may have various dimensions, such as 200 mm or 300 mm diameter wafers, as well as, rectangular or square panes. Unless otherwise noted, embodiments and examples described herein are conducted on substrates with a 300 mm diameter. In embodiments where the substrate is utilized to form a gate structure, a polysilicon layer may be disposed on a gate dielectric layer on the substrate.

At step 204, a gas mixture is supplied into the processing chamber 100 to provide ion species for the subsequent implantation process. The gas mixture may be supplied from the process gas source 152 to the gas distribution system 130, as described in FIG. 1A, or by other suitable means.

In one embodiment, the gas mixture supplied into the processing chamber 100 includes a reacting gas and an etching gas. The reacting gas provides desired ions to be implanted into the substrate. For example, the reacting gas may provide a source of desired ion species, such as B, P, Ga, As, and the like, used to form active dopants in the electric device to produce desired electrical performance and/or physical properties of the doped region of the substrate. In one embodiment, the reacting gases that may be used to provide an ion specie source include $B_2H_6$, $P_2H_5$, $PH_3$, GaN, $AsF_5$, and $PF_3$, among others.

In one embodiment, the etching gas may be a halogen containing gas. The etching gas is configured to slightly etch the ion species present on the substrate surface in the chamber, thus preventing excess ions being deposited on the substrate surface rather than implanting into the substrate. For example, in embodiments where the reacting gas is $B_2H_6$ gas, the $B_2H_6$ gas may be dissociated during the implantation process to produce ion species in form of $BH^{2+}$, $BH_2^+$ and $H^+$ ions. The halogen ions generated from the etching gas may efficiently react with the incompletely dissociated $BH^{2+}$, $BH_2^+$ and/or other by-product, forming halogen hydride which is then pumped out of the chamber, thus preventing the undesired ion species from depositing on the substrate. In one embodiment, the halogen containing etching gas may include $BF_3$, $BCl_3$, and the like.

In another embodiment, the gas mixture supplied into the processing chamber 100 may include an inert gas. Examples of suitable inert gases include $N_2$, Ar, He, Xe, and Kr and the like. The inert gas in the processing chamber 100 promotes the ion bombardment in the gas mixture, thereby efficiently increasing the probability of process gas collision, resulting in reduced recombination of ion species. The inert gas may be flowed in to the processing chamber at a rate between about 10 sccm and about 2000 sccm, such as between about 50 sccm and about 500 sccm.

Additionally, the gas mixture flow rate and/or gas mixture flow ratio among the reacting gas, etching gas and/or the inert gas may also be selected to control the relative amounts of the dissociated ion species during process between each type of gases. The selected gas mixture flow rate and/or flow ratio enables the gas mixture to be dissociated as a predetermined amount and/or ratios among different kinds of ion species, thereby balancing implantation, and etching by-product process which may occur during processing. Additionally, the selected amount of reacting and etching gas in the gas mixture may prevent excess amounts of another certain undesired types of ion species, such as $B_xH_y$ polymers that may not be readily and efficiently pumped out of the processing chamber from accumulating on the substrate and resulting in substrate contamination and change in the dopant profile.

In one embodiment, a ratio between the reacting gas and the etching gas in the gas mixture supplied at step 204 may be between about 0:10 and about 10:0. The reacting gas may be flowed into the processing chamber at a rate of between about 10 sccm and about 2000 sccm, such as between about 50 sccm and about 500 sccm and the halogen containing etching gas may be flowed in to the processing chamber at a rate between about 10 sccm and about 2000 sccm, such as between about 50 sccm and about 500 sccm at the time the gas mixture is initially supplied into the chamber at step 204.

At step 206, an ion implantation process is performed to implant ions generated from the gas mixture into the substrate. A RF source power is applied to generate a plasma from the gas mixture in the processing chamber 100. The plasma is continuously generated during the ratio change in the gas mixture supplied at step 204 to dissociate the gas mixture as ion species and implant into the substrate. A RF bias power may be applied along with the RF source power to dissociate and drive the dissociated the ion species from the gas mixture toward and into a desired depth from the substrate surface. The RF source and bias power applied to the chamber 100 may be controlled at a desired energy level, thereby allowing the ion species to be dissociated and doped with a desired concentration and depth in the substrate.

In one embodiment, the source RF power may be maintained at between about 100 Watts and about 5000 Watts. The bias RF power may be maintained at between about 100 Watts and about 10000 Watts at a RF voltage between about 100 Volts and about 15000 Volt.

Several process parameters may also be regulated during the plasma immersion ion implantation process at step 206. In one embodiment, the chamber pressure may be maintained at between about 4 mTorr and about 500 mTorr. The substrate temperature may be maintained at between about 10 degrees Celsius and about 100 degrees Celsius.

At step 208, the flow ratio of the reacting gas to the etching gas supplied in the gas mixture is adjusted while performing the ion implantation process. The flow ratio of the reacting gas and the etching gas may be dynamically controlled in a manner that provides different chemical reactions during processing. As the substrate may have different profiles formed on the substrate surface, the amount and/or concentration of the ions implanted into the substrate may be varied across the substrate surface. A longer overall process time may cause certain areas of the substrate surface to be saturated with implanted ions while the other areas may have an insufficient amount of implanted ions. By dynamically changing the ratio of the reacting and the etching gas in the gas mixture, over-saturated ions accumulated at certain areas of the substrate may be efficiently etched while simultaneously allowing ions implantation in unsaturated area. The overall process period may be segmented into multiple and/or cyclic steps, providing a predetermined segmented time period for gradually changing the ratio between the reacting and the etching gas in the gas mixture, thereby providing dynamically balanced etch-deposition process during implantation.

In one embodiment, the flow rate of the reacting gas may be slightly higher than the flow rate of etching gas when the process initially starts. The reacting gas is configured to be the major source of dopant ions for implanting into the substrate. A higher amount and/or ratio of reacting gas relative to the etching gas is desired in the initial stage of the method 200 to provide more ions for implanting with little or no etching ions, thereby protecting the exposed upper surface from damage by the etching gas. Subsequently, the flow rate and/or ratio of the etching gas may be gradually increased to remove ions which have deposited rather than implanted into the substrate surface. The reacting gas may be gradually decreased or kept a steady flow rate while the etching gas is increased in the gas mixture. Accordingly, the gradually increasing etching gas in the gas mixture etches and reacts with the excess amount of dopant ions from the reacting gas, thereby preventing the excess dopants from further implanted into the substrate and piling up in the substrate surface.

In embodiment where some patterns and/or structures, such as trenches, are formed on the substrate surface, the ions dissociated from the gas mixture tend to be predominantly implanted into a bottom portion of the structure and/or trench rather than into sidewall of the structure/trench. As the dissociated ions continue increasing in the chamber, the ions implanted into the bottom of the structure/trench may reach a saturated level while the sidewalls of the structure and/or trench may still not have a desired amount of implanted ions.

Continuously supplying greater amount of ions into the chamber may result in unwanted deposition accumulated on the bottom of the substrate surface, rather than increasing concentration of ions implanted into the sidewall of the structure/trench. Therefore, an etching gas may be selectively supplied at the appropriate stage of the implantation process to remove the excess materials accumulated on the bottom portion of the structure/trench while allowing the ions to continuously be implanted into the sidewalls of the structure/trench.

In one embodiment, the reacting gas may be gradually decreased at a rate between about 10 sccm per second and about 100 sccm per second and etching gas may be gradually turning up at a rate between about 10 sccm per second and about 100 sccm per second in a total process period of about 5 seconds to about 200 seconds. Alternatively, the flow rate of the reacting gas and the etching gas may be adjusted by a predetermined percentage at a predetermined process period.

In an exemplary embodiment, the reacting gas and the etching gas present in the gas mixture have different percentages at different stages or steps of an implant process, such as the process 200 described above. The overall process may be segmented into multiple steps and each step may have a different ratio of reacting gas to etching gas. The gas mixture includes a reacting gas percentage about 100 percent and an etching gas percentage about 0 percent at an initial step (i.e., the beginning of the implantation process). Subsequently, the reacting gas percentage is gradually reduced to about 80 percent of the gas mixture and the etching gas percentage is correspondingly gradually increased to about 20 percent at the following step. The reacting gas percentage is continuously reducing in the gas mixture while the etching gas percentage is continuously increasing at the following steps until the gas mixture is fully complied and filled with the etching gas at the final step. It is noted that the process period may be segmented into as many as steps to meet different process requirements, and/or performed gradually rather than step-wise. In an exemplary embodiment, each segment of each process may have a time period between about 2 second and about 20 seconds.

In an exemplary embodiment depicted in the present invention, the reacting gas and the etching gas supplied in the gas mixture are $B_2H_6$ and $BF_3$ respectively. The gas mixture initially supplied into the chamber has a higher ratio of $B_2H_6$ gas ratio than of $BF_3$ gas. After processing for a predetermined period of time, such as between about 10 and about 30 seconds, the ratio between the $B_2H_6$ gas and the $BF_3$ gas may be gradually changed to an increasing amount of $BF_3$ gas in the gas mixture. In one embodiment, the gas ratio between $B_2H_6$ and $BF_3$ gas may be about 5:0 (100 percent of $B_2H_6$ gas to 0 percent of $BF_3$ gas) at the time initially supplied into the chamber to commence the process. Subsequently, $B_2H_6$ gas may be gradually reduced at a rate between about 10 sccm per second and about 100 sccm per second and $BF_3$ gas may be gradually tuning up at a rate between about 10 sccm per second and about 100 sccm per second at an overall process time may be performed between about 5 seconds and about 200 seconds. In embodiments wherein the overall process period is segmented into five steps for having about between 5 second to about 20 seconds in each step, the gas flow amount of $B_2H_6$ and $BF_3$ gas may be controlled by a relative gas ratio, such as from 100:0 to 80:20, 60:40, 40:60, 20:80, 0:100 at each process step. At the time the final step, e.g., the fifth step, is performed, the gas ratio between $B_2H_6$ and $BF_3$ may be adjusted to a ratio between about 0:5 to complete the final process step.

Thus, methods for implanting ions into a substrate by a plasma immersion ion implanting process are provided. The improved method advantageously implants a desired amount of dopants to form a desired implanted profile on a substrate surface, thereby providing an uniform doped ion concentration cross the substrate and forming electric devices on the substrate with desired electrical performance.

While the foregoing is directed to embodiments of the present invention, other and further embodiments of the invention may be devised without departing from the basic scope thereof, and the scope thereof is determined by the claims that follow.

What is claimed:

1. A method of conformally doping a substrate, the substrate having trenches with side walls and bottom portions, the method comprising:
   disposing the substrate in a plasma chamber;
   providing a dopant source and an etchant to the chamber;
   forming an inductively coupled plasma in the chamber;
   biasing the substrate; and
   controlling implanting dopants in the side walls and the bottom portions by adjusting a ratio of etchant flow rate to dopant source flow rate into the chamber while implanting dopants in both the side walls and the bottom portions, wherein the ratio is gradually increased while dopants are implanted.

2. A method of implanting dopants into a substrate, the substrate having trenches with side walls and bottom portions, the method comprising:
   positioning a substrate in a plasma immersion ion implant chamber;
   providing a dopant source to the chamber;
   forming a plasma from the dopant source;
   implanting dopants into the side walls and bottom portions;
   providing an etchant to the chamber; and
   balancing reacting the etchant with dopants deposited on the bottom portions while implanting dopants in both the bottom portions and the side walls, wherein the etchant flow rate and the dopant source flow rate form a ratio of etchant to dopant, and the ratio is gradually increased while dopants are implanted.

3. The method of claim 2, wherein the ratio is increased in sequential steps.

4. The method of claim 2, wherein increasing the ratio of etchant to dopant comprises gradually reducing the dopant source flow rate.

5. The method of claim 1, wherein the ratio is increased in sequential steps.

6. The method of claim 1, wherein increasing the ratio of etchant flow rate to dopant source flow rate comprises gradually reducing the dopant source flow rate.

* * * * *